United States Patent
Matsumura

(10) Patent No.: US 9,937,798 B2
(45) Date of Patent: Apr. 10, 2018

(54) WRAP AROUND BUS BAR FOR VEHICLE POWER DISTRIBUTION DEVICE

(71) Applicant: SUMITOMO WIRING SYSTEMS, LTD., Yokkaichi, Mie (JP)

(72) Inventor: Akihiro Max Matsumura, Farmington Hills, MI (US)

(73) Assignee: Sumitomo Wiring Systems, Ltd., Yokkaichi, Mie (JP)

( * ) Notice: Subject to any disclaimer, the term of this patent is extended or adjusted under 35 U.S.C. 154(b) by 202 days.

(21) Appl. No.: 14/853,287

(22) Filed: Sep. 14, 2015

(65) Prior Publication Data

US 2017/0072802 A1    Mar. 16, 2017

(51) Int. Cl.
   *B60L 1/00*    (2006.01)
(52) U.S. Cl.
   CPC ...................... *B60L 1/00* (2013.01)
(58) Field of Classification Search
   CPC ............................................... B60L 1/00
   USPC ............................................... 307/9.1
   See application file for complete search history.

(56) References Cited

U.S. PATENT DOCUMENTS

| 8,573,987 B1 * | 11/2013 | Schweitzer | ............ | H01R 9/226 |
|---|---|---|---|---|
| | | | | 439/457 |
| 2013/0029501 A1 * | 1/2013 | I | ............... | H01R 9/226 |
| | | | | 439/76.2 |

FOREIGN PATENT DOCUMENTS

| JP | H09284952 A | 10/1997 |
|---|---|---|
| JP | 2005269867 | 9/2005 |
| JP | 2007330044 A | 12/2007 |
| JP | 2008079482 | 4/2008 |
| JP | 2009284622 | 12/2009 |
| JP | 2013021757 A | 1/2013 |
| JP | 2014087221 A | 5/2014 |

OTHER PUBLICATIONS

English machine translation provide for document JP2013021757.*
English machine translation provide for document JP2014087221.*
International Search Report for Application No. PCT/US2016/051678 dated Sep. 14, 2016, 5 pages.

* cited by examiner

*Primary Examiner* — Alfonso Perez Borroto
(74) *Attorney, Agent, or Firm* — Reising Ethington, P.C.

(57) ABSTRACT

A wrap around bus bar that provides battery power (also referred to as B+ power) to components within a power distribution device for a vehicle electrical system, such as a hybrid-type power distribution box (PDB). The power distribution device routes or distributes power throughout a vehicle electrical system and may include a lower cover, a wrap around bus bar, a relay block assembly, a module with a printed circuit board (PCB), an array of relays and fuses, and an upper cover. Battery power is provided from a vehicle battery and/or alternator to a terminal connection, from the terminal connection to the wrap around bus bar, and from the wrap around bus bar to the relay block assembly, the module and potentially other components within the power distribution device.

15 Claims, 4 Drawing Sheets

WRAP AROUND BUS BAR FOR VEHICLE POWER DISTRIBUTION DEVICE

FIELD

The present invention relates generally to a power distribution device for a vehicle electrical system and, more specifically, to a bus bar within the power distribution device.

BACKGROUND

There are various types of power distribution devices used in vehicle electrical systems, some of these devices are referred to as power distribution boxes, electrical connection boxes, electrical junction boxes, power centers, etc. A power distribution device distributes low voltage battery power to various accessories and devices within a vehicle electrical system. In many power distribution device designs, electrically conductive metallic strips or bars, commonly referred to as bus bars, are used to provide battery power to components within the power distribution device. The overall amount of current or amperage that can be handled by a particular bus bar is dictated by its material composition, as well as the size and configuration of the bus bar (e.g., the cross sectional area of the bus bar affects the amount of current that can be accommodated by the bus bar).

In certain prior art designs, bus bars have a relatively simple design with only a few sides (e.g., one- or two-sided designs). One potential drawback of this type of bus bar is that the relatively simple design may limit or otherwise constrain the design options for the overall arrangement or configuration of the power distribution device. This is particularly true with a more complex type of power distribution device, such as a "hybrid-type" of power distribution box (PDB) that includes a separate module and relay block, both of which need to be provided with battery power via a bus bar. Providing battery power to both a module and a relay block packaged within a single PDB can be difficult with some traditional bus bar designs and may even require multiple bus bars.

Skilled artisans will appreciate that by providing a power distribution device with an improved bus bar design, the configuration and design options for the device can be improved.

SUMMARY

According to one aspect, there is provided a wrap around bus bar for use in a power distribution device that is part of a vehicle electrical system. The wrap around bus bar may comprise: a battery side having a battery connection, the battery connection secures a battery terminal to the wrap around bus bar and provides for an electrical connection therebetween; a module side having a module connection, the module connection secures the wrap around bus bar to a module in the power distribution device having a printed circuit board (PCB) and provides for an electrical connection therebetween; and a relay block side having a relay block connection, the relay block connection secures the wrap around bus bar to a relay block assembly in the power distribution device and provides for an electrical connection therebetween.

DRAWINGS

Preferred exemplary embodiments of the invention will hereinafter be described in conjunction with the appended drawings, wherein like designations denote like elements, and wherein.

DESCRIPTION

Figures 1, 2:
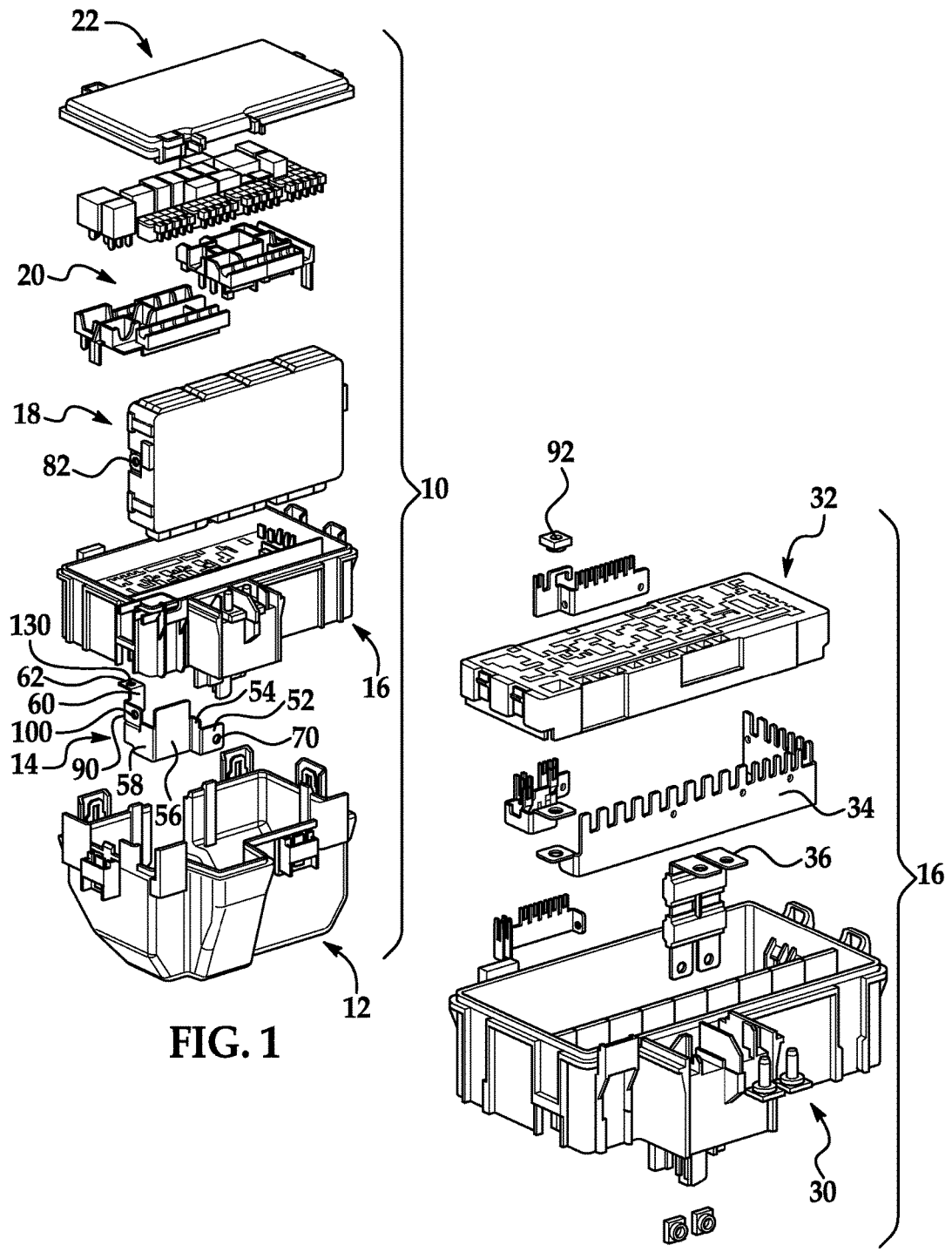
FIG. 1 is an exploded perspective view of an exemplary power distribution device.
FIG. 2 is an exploded perspective view of an exemplary relay block assembly that may be used with the power distribution device of FIG. 1.

There is described herein a wrap around bus bar that provides battery power (also referred to as B+ power) to components within a power distribution device for a vehicle electrical system, such as a hybrid-type power distribution box (PDB). With reference to FIG. 1, there is shown a power distribution device 10 that routes or distributes power throughout a vehicle electrical system and generally includes a lower cover 12, a wrap around bus bar 14, a relay block assembly 16, a module 18 with a printed circuit board (PCB), an array of relays and fuses 20, and an upper cover 22. Battery power is provided from a vehicle battery and/or alternator (not shown) to a terminal connection 72, from the terminal connection to the wrap around bus bar 14, and from the wrap around bus bar to the relay block assembly 16, the module 18, and potentially other components within the power distribution device 10.

The following description is directed to different embodiments and features of the wrap around bus bar 14 and its role within the power distribution device 10. Due to its multi-sided wrap around configuration, the bus bar 14 is particularly well suited for use with relatively complex power distribution device designs, like the hybrid-type power distribution box (PDB) 10 that includes a separate relay block assembly 16 and module 18 having its own printed circuit board (PCB). Those skilled in the art will appreciate that the wrap around bus bar 14 may be used with any number of different types of power distribution devices and is not limited to the exemplary hybrid-type power distribution box (PDB) 10 shown here. The term "hybrid-type power distribution box," as used herein, broadly refers to a power distribution device in a vehicle electrical system that includes both a relay block assembly and a separate module all packaged into a single device. The relay block assembly includes a collection of relays, fuses and/or other traditional electrical components, while the separate module has its own printed circuit board (PCB) and is sometimes referred to as a relay module, a junction block or a bused electrical center.

Figure 3:
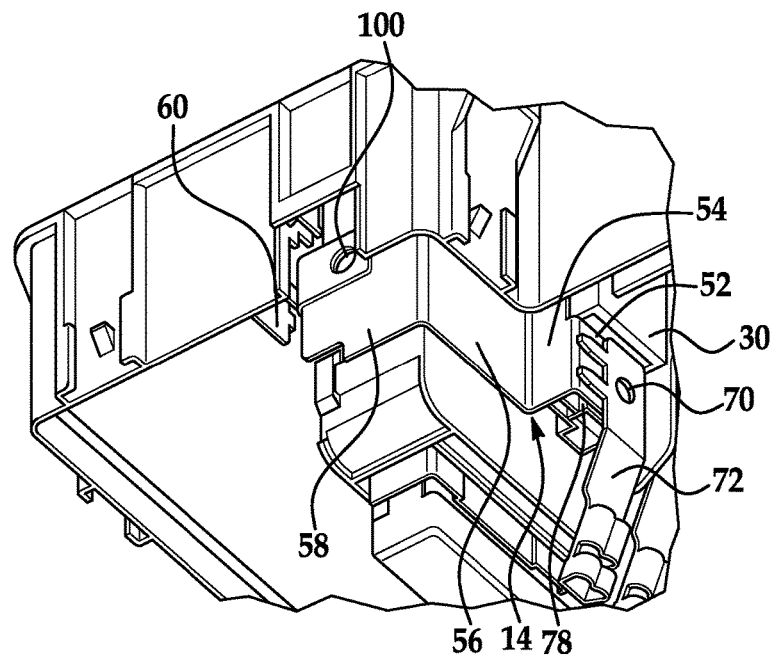
FIGS. 3 and 4 are partial perspective views of the relay block assembly of FIG. 2, where the partial perspective views are taken from an underside of the relay block assembly.
Figure 4:
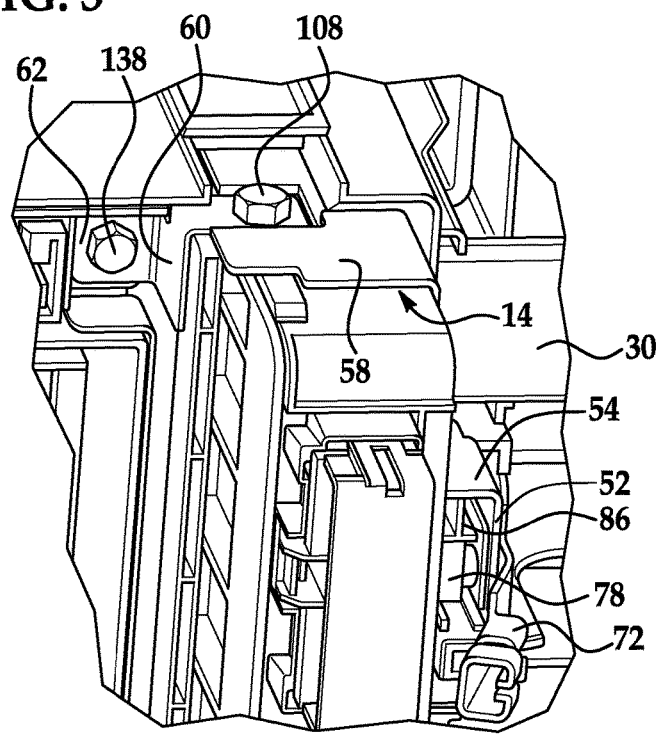

The relay block assembly 16 is further shown in FIGS. 2-4, and generally includes a relay block lower housing 30, a relay block 32, a relay block bus bar 34, an internal connector 36, as well as a number of other components needed for proper assembly and connection. It is envisioned that the relay block assembly 16 will be assembled before inserted with the other parts into the larger power distribution box (PDB) 10. However, the PDB is not limited to any particular assembly sequence and can be assembled according to any suitable method or order of steps.

The wrap around bus bar 14 is a multi-sided, electrically conductive metallic strip that provides battery power to various components within the power distribution device 10. The particular design or configuration of the wrap around bus bar 14 is typically application or product specific; that is, the bus bar is custom designed for a particular power distribution device so that it can wrap around and tightly conform to the shape and size of the adjacent components or parts. The wrap around bus bar 14 is preferably stamped, blanked or otherwise formed from a flat strip of conductive material (e.g., stainless steel, pure copper or copper-based alloy, pure aluminum or aluminum-based alloy, or some other suitable metal or metal alloy) and is supported by insulating components like relay block lower housing 30 or the outside cover of module 18 so that the vehicle electrical system does not become shorted. According to the exemplary embodiment shown in FIGS. 3-5, the wrap around bus bar 14 is designed for use in a relatively complex hybrid-type power distribution box and balances current flow through the bus bar in an efficient manner, the bus bar includes a battery side 52, intermediate sides 54, 56 and 60, a module side 58, and a relay block side 62.

The battery side 52 of the wrap around bus bar 14 includes a battery connection 70 for connecting the bus bar with a battery terminal 72, as well as inward and outward surfaces 74, 76. In the non-limiting example shown in the drawings, the battery side 52 is a flat, rectangular surface that includes a battery connection 70 in the form of an interior hole or opening that passes entirely through the bus bar and is designed to receive a bolt 74 for securing the battery terminal 72 and the wrap around bus bar 14 to a threaded boss 78 formed in the relay block lower housing 30; this is best shown in FIGS. 3 and 4. The inward or rear surface 74 contacts and lays against the threaded boss 78, which is made of an injected or molded plastic and is electrically insulated. The battery terminal 72, on the other hand, lays flat against the outward or front surface 76 such that a metal-to-metal interface establishes an electrical connection between the two components and enables current to flow from the battery terminal to the bus bar.

The intermediate side 54 is integrally formed with the battery side 52 and includes inward and outward surfaces 80, 82. According to the illustrated example, the intermediate side 54 is connected to battery side 52 via a ninety-degree exterior corner 84 such that the two sides are generally perpendicular to one another, and side 54 is flat and rectangular. The term "exterior corner," as used herein, refers to a bend in the bus bar that forms an exterior edge where the outward surfaces of the two sides involved (in this case, outwards surfaces 76 and 82) face away from each other, as opposed to an interior pocket where they face towards each other. When installed, the inward or rear surface 80 may contact and be supported by a standoff or other feature 86 formed in the relay block lower housing 30, as best shown in FIG. 4.

Figure 5:
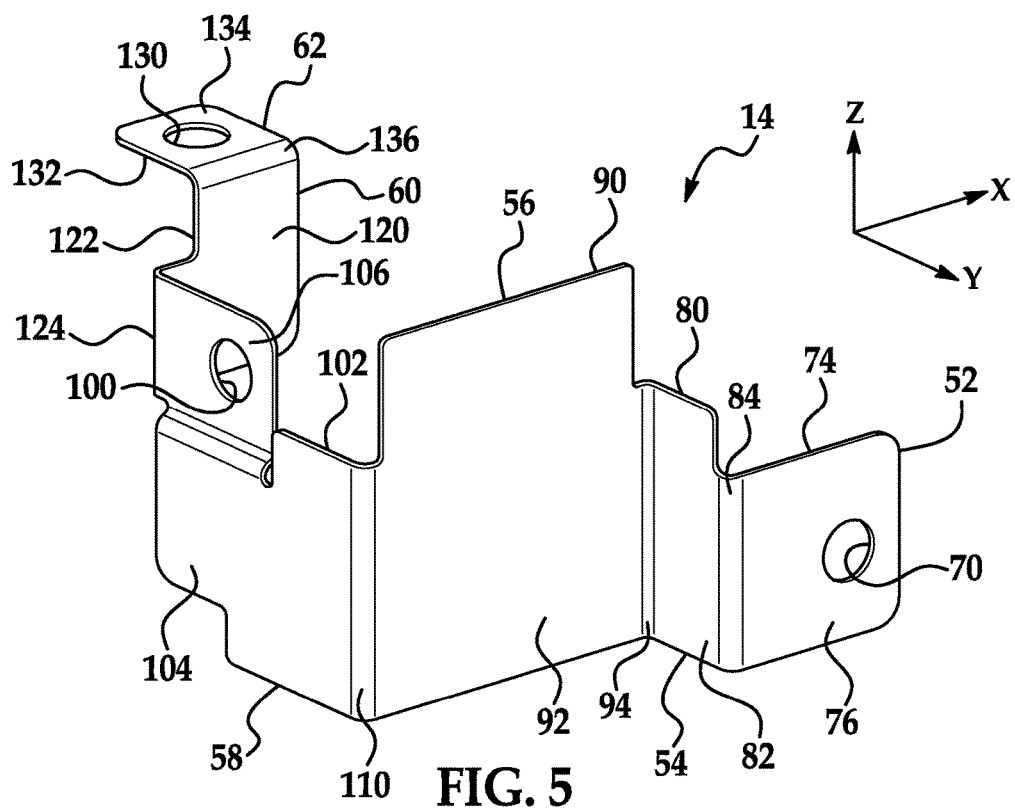
FIG. 5 is a perspective view of an exemplary wrap around bus bar that may be used with the relay block assembly of FIGS. 1-3.

The intermediate side 56 is integrally connected to the intermediate side 54 and includes inward and outward surfaces 90, 92. As illustrated in FIG. 5, the intermediate side 56 is also flat and rectangular and may be the largest side or wall of the wrap around bus bar 14 in terms of area. When installed, the inward surface 90 is supported by a housing unit of the module 18 such that the bus bar 14 wraps around an end section of the module. Side 56 is integrally connected to side 54 via a ninety-degree interior corner 94 such that the two sides are generally perpendicular to one another. The term "interior corner," as used herein, refers to a bend in the bus bar that forms an interior pocket where the outward surfaces of the two sides involved (in this case, 82 and 92) face towards each other. Because the corners 84 and 94 are of opposite types (that is, exterior versus interior, respectively), sides 52 and 56 are parallel and shifted from one another in the x-axis direction, instead of being overlapping in that direction. If the corners 84 and 94 were both exterior corners, like corners 110 and 124 (subsequently described) for example, then sides 52, 56 would at least partially overlap one another in the x-axis direction.

The module side 58 includes a module connection 100 for providing battery power to a printed circuit board (PCB) within module 18, and also includes inward and outward surfaces 102, 104. In the exemplary embodiment shown in FIGS. 3-5, module side 58 is not entirely planar, as module connection 100 is formed in a recessed or set back portion 106 of that side. This is not necessary, but it may be a useful feature when fitting the wrap around bus bar 14 on the end of the module 18 and positioning the bus bar such that the module connection 100 lines up with a threaded hole in the module. Accordingly, the recessed portion 106 may be configured to complement a corresponding recess in the module housing and act as a locating feature of sorts. According to the illustrated example, module connection 100 is in the form of an interior hole or opening that passes entirely through the bus bar and is designed to receive a bolt 108 that secures the wrap around bus bar 14 to the module 18 and electrically connects these two components together. It should be appreciated that in other embodiments, connection 100 could be used to connect the bus bar to a different device other than module 18, such as the relay block assembly 16, for example. The module side 58 is integrally connected to intermediate side 56 via a ninety-degree exterior corner 110 such that the two sides are generally perpendicular to one another. Because the corners 94 and 110 are of opposite types (that is, interior versus exterior, respectively), sides 54 and 58 are parallel and shifted from one another in the y-axis direction, instead of being overlapping in that direction.

Intermediate side 60 is integrally connected to module side 58 and, like the other sides, includes inward and outward surfaces 120, 122. According to the illustrated embodiment, the intermediate side 60 is like a leg portion that extends upwards from the module side 58 in the z-axis direction and is integrally connected to the module side via a ninety-degree exterior corner 124 such that the two sides are perpendicular to one another. Due to exterior corners 110 and 124, intermediate sides 56 and 60 are parallel to one another and at least partially overlap in the x-axis direction; in this particular embodiment, sides 56 and 60 are the only pair of sides within the wrap around bus bar 14 that overlap.

Relay block side 62 includes a relay block connection 130 for providing battery power to the relay block assembly 16, and also includes inward and outward surfaces 132, 134. As with the other connections, relay block connection 130 is provided in the form of an interior hole that passes entirely through the bus bar and is designed to accommodate a bolt 138 that physically and electrically connects the bus bar 14 to the relay block assembly 16. It will be noticed from FIG. 5 that the relay block side 62 extends from an upper end of the intermediate side 60 via an interior corner 136 in such a manner that the relay block side 62 is not parallel to any other sides or walls of the wrap around bus bar 14. This configuration is not necessary, but it does provide the wrap around bus bar 14 with a unique design that helps it electrically connect to both the relay block assembly 16 and the module 18. Skilled artisans will recognize that the wrap around bus bar 14 makes connections with a battery terminal 72, a relay block assembly 16, and a module 18, where each of these connections is carried out on a different side or wall of the bus bar. Such a configuration is not only useful when trying to accommodate rather complex hybrid-type power distribution box designs, but it can also help balance or distribute the flow of electrical current within the bus bar so that the metal does not become unacceptably overheated in any particular area. Other configurations, including those with a different number of sides like the embodiments shown in FIGS. 6 and 7, are certainly possible.

Figure 6:
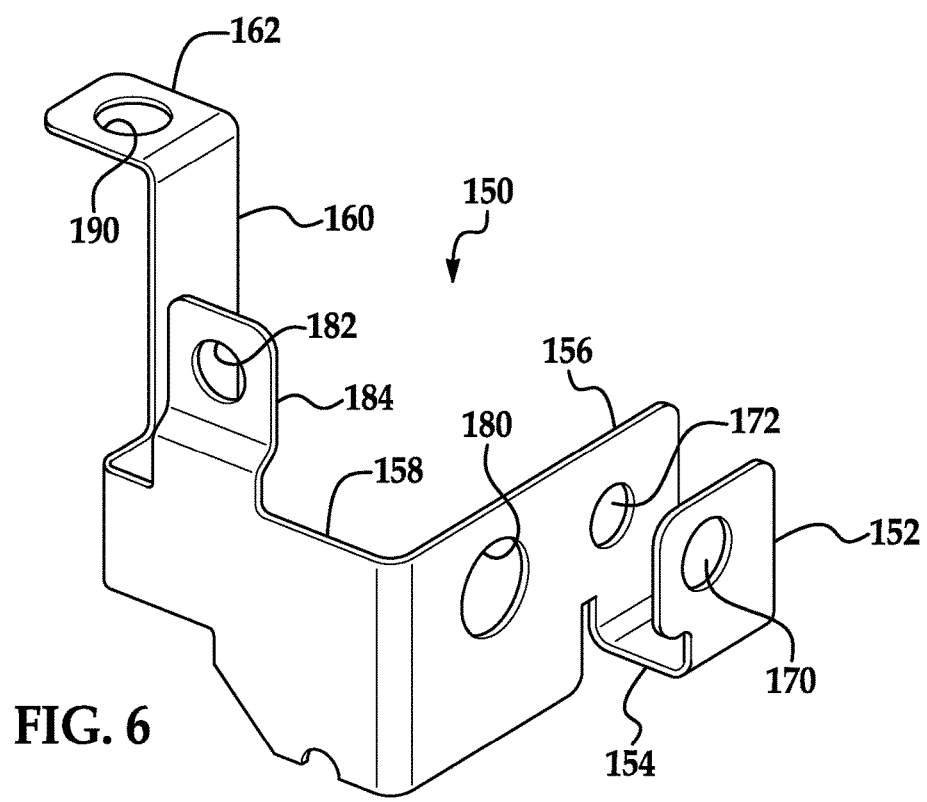
FIGS. 6 and 7 are perspective views of alternative exemplary wrap around bus bars that may be used with a relay block assembly, such as the one of FIGS. 1-3.
Figure 7:
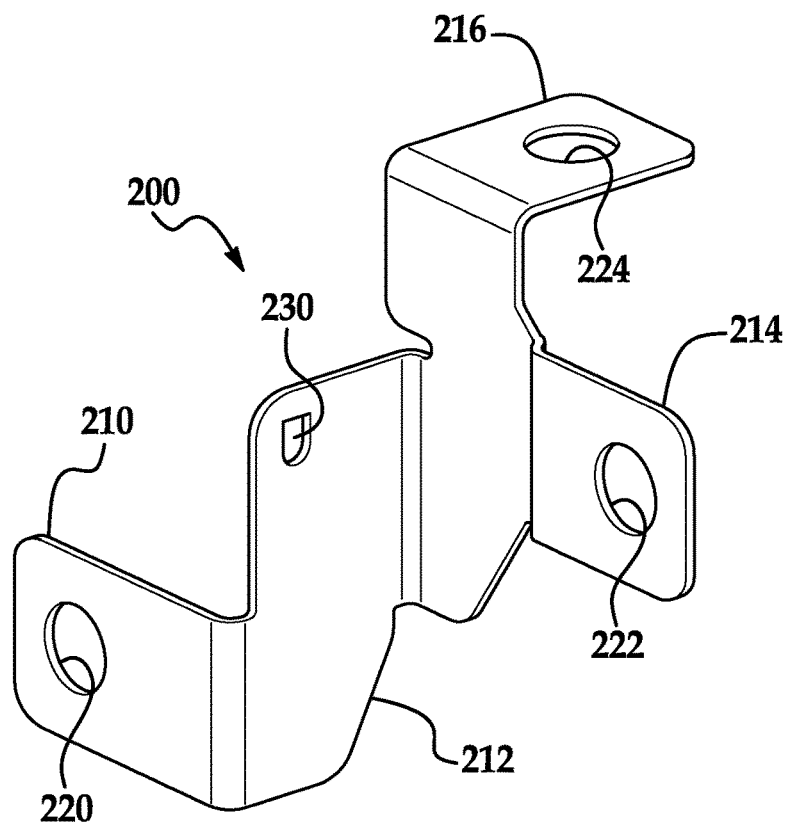

Turning now to FIGS. 6 and 7, there are shown two additional embodiments of the wrap around bus bar. The wrap around bus bar 150 in FIG. 6 is similar to the previous embodiment described, except that the bus bar has a somewhat different configuration including a device side 152, an intermediate side 154, a battery side 156, a module side 158, an intermediate side 160, and a relay block side 162. The device side 152 and battery side 154 include cooperating device connections 170, 172 that are in the form of interior holes that receive a bolt for physically and electrically connecting the bus bar 150 with one or more additional devices within the power distribution device, such as high current devices, etc. Similarly, the battery side 156 has a battery connection 180 that receives a threaded bolt for connecting a battery terminal (not shown) to the wrap around bus bar 150, the module side 158 includes a module connection 182 on a recessed portion 184 of the module side for connecting the bus bar 150 to a module having its own printed circuit board (PCB), and the relay block side 162 has a relay connection 190 for connecting the bus bar to a relay block assembly.

Figure 8:
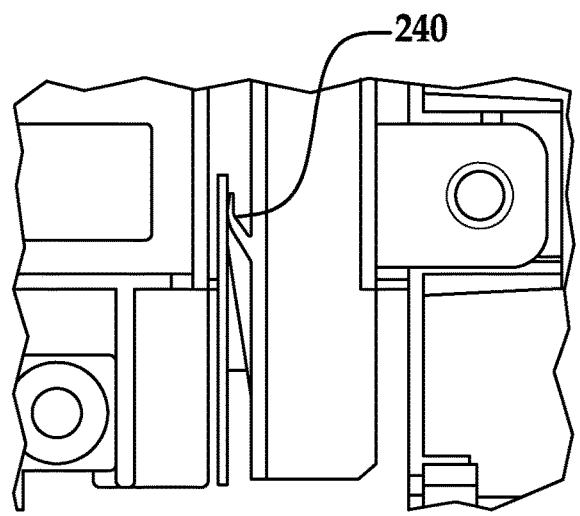
FIG. 8 is a side view of a portion of a relay block assembly showing an exemplary locking hole and locking tab.

The wrap around bus bar 200 of FIGS. 7 and 8 is also similar to the previously described embodiments, but includes a battery side 210, an intermediate side 212, a module side 214, and a rely block side 216. As with the previous embodiments, the battery side 210, the module side 214 and the relay block side 216 respectively include a battery connection 220, a module connection 222 and a relay block connection 224, where all of the connections are on different sides of the bus bar and are in the form of holes that accommodate threaded bolts that attach the bus bar to the other components of the power distribution device. In this embodiment, a locking hole 230 is provided that enables the wrap around bus bar 200 to snap-in-place before being bolted down. A single locking hole 230 is shown on the intermediate side 212, however, other locking features could be provided in addition to or in lieu hole 230 and could be provided on any number of suitable sides or portions of the wrap around bus bar. In this example, the locking hole 230 is a window shaped hole that includes three linear or nearly linear sides and one curvilinear or arched side to form a window shaped opening. A corresponding locking tab 240 may resiliently extend from another part of the power distribution device, such as the relay block lower housing 30 or a housing unit of module 18, such that it passes through the locking hole 230 and secures the wrap around bus bar 200 in place; this is illustrated in FIG. 8. Skilled artisans will appreciate that the locking hole 230 shown in the drawings is merely exemplary and that other locking holes and features, including ones having different sizes and shapes, could be used with the wrap around bus bars.

It should be appreciated that the previously described wrap around bus bars are merely exemplary and that other designs and embodiments may be employed instead. Moreover, any of the features or characteristics described in conjunction with one embodiment may be implemented on a different embodiment as well. For instance, the locking hole and locking tab shown in FIGS. 7 and 8 may be use with wrap around bus bars shown in FIGS. 5 and 6.

Once the wrap around bus bar is installed within the power distribution device 10, the bus bar at least partially wraps around portions of both the relay block assembly 16 and the module 18 and makes at least three separate electrical connections: one where a battery connection 70, 180 and 220 connects to and receives battery or B+ power from a battery terminal, one where a module connection 100, 182 and 222 connects to and provides battery power to a module 18 with a printed circuit board (PCB), and one where a relay block connection 130, 190 and 224 connects to and provides battery power to a relay block assembly 16. In most prior art designs involving a hybrid-type power distribution box (PDB) with a separate module and relay block, multiple bus bars would have been required to make all of the aforementioned connections, yet the wrap around bus bar described herein is able to accomplish it with a single component. Thus, the present wrap around bus bar is able to ease and simplify making various electrical connections within a power distribution device, such as a hybrid-type PDB where battery power needs to be provided to both a module and a relay block assembly.

It is to be understood that the foregoing is a description of one or more preferred exemplary embodiments of the invention. The invention is not limited to the particular embodiment(s) disclosed herein, but rather is defined solely by the claims below. Furthermore, the statements contained in the foregoing description relate to particular embodiments and are not to be construed as limitations on the scope of the invention or on the definition of terms used in the claims, except where a term or phrase is expressly defined above. Various other embodiments and various changes and modifications to the disclosed embodiment(s) will become apparent to those skilled in the art. All such other embodiments, changes, and modifications are intended to come within the scope of the appended claims.

As used in this specification and claims, the terms "for example," "e.g.," "for instance," "such as," and "like," and the verbs "comprising," "having," "including," and their other verb forms, when used in conjunction with a listing of one or more components or other items, are each to be construed as open-ended, meaning that the listing is not to be considered as excluding other, additional components or items. Other terms are to be construed using their broadest reasonable meaning unless they are used in a context that requires a different interpretation.

The invention claimed is:

1. A wrap around bus bar for use in a power distribution device that is part of a vehicle electrical system, comprising:
   a battery side having a battery connection, the battery connection secures a battery terminal to the wrap around bus bar and provides for an electrical connection therebetween;
   a first intermediate side;
   a second intermediate side;
   a module side having a module connection, the module connection secures the wrap around bus bar to a module in the power distribution device having a printed circuit board (PCB) and provides for an electrical connection therebetweeen;
   a third intermediate side; and
   a relay block side having a relay block connection, the relay block connection secures the wrap around bus bar to a relay block assembly in the power distribution device and provides for an electrical connection therebetween;

wherein the second intermediate side and the module side are integrally connected and form a first exterior corner, the module side and the third intermediate side are integrally connected and form a second exterior corner, the second and third intermediate sides are parallel to one another, and the wrap around bus bar is configured so that the second intermediate side, the first exterior corner, the module side, the second exterior corner and the third intermediate side join to wrap around an end of the module in the power distribution device.

2. The wrap around bus bar of claim 1, wherein the battery connection is in the form of an interior hole that passes entirely through the battery side and is configured to receive a bolt for securing the battery terminal to the wrap around bus bar.

3. The wrap around bus bar of claim 1, wherein the battery side further includes an inward surface and an outward surface, the battery side inward surface is supported by a threaded boss formed in a relay block housing and the battery side outward surface lays flat against the battery terminal.

4. The wrap around bus bar of claim 1, wherein the module connection is in the form of an interior hole that passes entirely through the module side and is configured to receive a bolt for securing the wrap around bus bar to the module.

5. The wrap around bus bar of claim 1, wherein the module side further includes a recessed portion where the module connection is formed, the recessed portion is configured to complement a corresponding recess in the module and acts as a locating feature for aligning the wrap around bus bar with the module.

6. The wrap around bus bar of claim 1, wherein the relay block connection is in the form of an interior hole that passes entirely through the relay block side and is configured to receive a bolt for securing the wrap around bus bar to the relay block assembly.

7. The wrap around bus bar of claim 1, wherein at least one of the sides of the wrap around bus bar includes a locking hole that is configured to receive a resilient locking tab and secure the wrap around bus bar within a relay block assembly.

8. The wrap around bus bar of claim 7, wherein the locking hole is configured in a window-like shape that includes three linear sides and one curvilinear side.

9. The wrap around bus bar of claim 1, wherein the first intermediate side is integrally connected to the battery side via a ninety-degree exterior corner such that the battery side and the first intermediate side are perpendicular to one another.

10. The wrap around bus bar of claim 9, wherein the second intermediate side is integrally connected to the first intermediate side via a ninety-degree interior corner such that the first and second intermediate sides are perpendicular to one another and such that the battery side and the second intermediate side are parallel and non-overlapping in an x-axis direction.

11. The wrap around bus bar of claim 10, wherein the module side is integrally connected to the second intermediate side via a first exterior corner, the first exterior corner is a ninety-degree exterior corner such that the module side and the second intermediate side are perpendicular to one another and such that the module side and the first intermediate side are parallel and non-overlapping in an y-axis direction.

12. The wrap around bus bar of claim 11, wherein the third intermediate side is integrally connected to the module side via a second exterior corner, the second exterior corner is a ninety-degree exterior corner such that the module side and the third intermediate side are perpendicular to one another and such that the second and third intermediates sides are parallel and at least partially overlapping in an x-axis direction.

13. The wrap around bus bar of claim 12, wherein the relay block side is integrally connected to the third intermediate side via a ninety-degree interior corner such that the relay block side and the third intermediate side are perpendicular to one another and such that the relay block side is not parallel to any other side of the wrap around bus bar.

14. The wrap around bus bar of claim 1, wherein the wrap around bus bar is stamped or blanked out of at least one of the following metals: stainless steel, copper, copper-based alloy, aluminum or aluminum-based alloy.

15. A hybrid-type power distribution box (PDB), comprising a lower cover, a relay block assembly, a module with a printed circuit board (PCB), an upper cover, and the wrap around bus bar of claim 1, wherein the wrap around bus bar is connected with and provides battery power to the relay block assembly and the module.

* * * * *